United States Patent
Kondo

(10) Patent No.: US 10,705,153 B2
(45) Date of Patent: Jul. 7, 2020

(54) METHODS AND APPARATUS FOR MEASURING BATTERY CHARACTERISTICS

(71) Applicant: SEMICONDUCTOR COMPONENTS INDUSTRIES, LLC, Phoenix, AZ (US)

(72) Inventor: Hideo Kondo, Ora-gun (JP)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 577 days.

(21) Appl. No.: 15/461,622

(22) Filed: Mar. 17, 2017

(65) Prior Publication Data
US 2018/0267110 A1    Sep. 20, 2018

(51) Int. Cl.
| | |
|---|---|
| *G01R 31/392* | (2019.01) |
| *G01R 31/389* | (2019.01) |
| *G01R 31/3828* | (2019.01) |
| *G01R 31/3835* | (2019.01) |
| *G01R 31/3832* | (2019.01) |

(52) U.S. Cl.
CPC ......... *G01R 31/392* (2019.01); *G01R 31/389* (2019.01); *G01R 31/3828* (2019.01); *G01R 31/3832* (2019.01); *G01R 31/3835* (2019.01)

(58) Field of Classification Search
CPC ...... H01M 2/00; H01M 2200/00; G01R 1/00; H02J 1/00
See application file for complete search history.

(56) References Cited

U.S. PATENT DOCUMENTS

| | | | |
|---|---|---|---|
| 2008/0233469 A1 | 9/2008 | Drozda et al. | |
| 2010/0030499 A1 | 2/2010 | Kawahara et al. | |
| 2011/0077879 A1* | 3/2011 | Paryani | H02J 7/0073 702/63 |
| 2012/0223670 A1 | 9/2012 | Kinjo et al. | |
| 2013/0185008 A1 | 7/2013 | Itabashi et al. | |
| 2014/0269811 A1* | 9/2014 | Maleki | H01M 10/486 374/1 |
| 2014/0333265 A1 | 11/2014 | Kinjo et al. | |
| 2015/0070024 A1* | 3/2015 | Kim | H01M 10/48 324/430 |
| 2015/0160302 A1* | 6/2015 | Xu | H01M 10/42 324/427 |
| 2015/0219721 A1* | 8/2015 | Yang | H02J 7/0021 324/437 |
| 2015/0301122 A1 | 10/2015 | Lee | |
| 2016/0097819 A1 | 4/2016 | Ohkawa et al. | |
| 2016/0252585 A1 | 9/2016 | Baba et al. | |

* cited by examiner

*Primary Examiner* — Jermele M Hollington
*Assistant Examiner* — Temilade S Rhodes-Vivour
(74) *Attorney, Agent, or Firm* — The Noblitt Group, PLLC; Hettie L. Haines

(57) ABSTRACT

Various embodiments of the present technology may comprise a method and apparatus for measuring battery characteristics. In various embodiments, the apparatus comprises a lithium ion battery and a fuel gauge to monitor the resistance of the battery and the capacity of battery as it ages. The fuel gauge may perform two different methods for computing two different capacity values. The fuel gauge may utilize the capacity values from each method to determine the resistance of the battery as it ages and related battery characteristics, such as the state of health of the battery.

20 Claims, 4 Drawing Sheets

METHODS AND APPARATUS FOR MEASURING BATTERY CHARACTERISTICS

BACKGROUND OF THE TECHNOLOGY

"Battery capacity" is a measure (typically in ampere-hours) of the charge stored by the battery, and is determined by the mass of active material contained in the battery. The battery capacity represents the maximum amount of energy that can be extracted from the battery under certain specified conditions.

The effective storage capacity of the battery, however, diminishes with age and undergoes irreversible damage. This damage is caused by corrosion and other irreversible chemical processes. Aging of the internal battery components contributes to the damage as well. The plates of the cells corrode, and as the plates corrode, their operational surface area diminishes and the electrolyte undergoes chemical changes, causing them both to be less chemically reactive. The changes reduce the volume of reactive components in the cell, reducing the charge capacity of the cell. It also increases the internal resistance of the cell, as the corrosion products inhibit the free flow of electrons through the plates. Each charge/discharge cycle of the battery also has a similar effect but at an accelerated rate. As a result, as the battery ages and deteriorates, the effective capacity of the battery decreases, reducing the amount of time the battery can supply power to a device. In addition, the voltage level drops off faster, applying a decreasing voltage to the device.

One indicator of the battery's ability to retain charge is the battery "state of health." Many applications use this parameter to estimate battery performance, for example the "run-time" of the battery, which reflects the amount of time the battery will continue to provide power before it dies. An accurate estimate of the run-time is desired to provide alerts to a user.

Conventional methods for measuring the effective capacity of the battery are inefficient and prone to errors because many methods require removal of the battery from the device to measure various parameters that are affected by aging.

SUMMARY OF THE INVENTION

Various embodiments of the present technology may comprise a method and apparatus for measuring battery characteristics. In various embodiments, the apparatus comprises a lithium ion battery and a fuel gauge to monitor the resistance of the battery and the capacity of battery as it ages. The fuel gauge may perform two different methods for computing two different capacity values. The fuel gauge may utilize the capacity values from each method to determine the resistance of the battery as it ages and related battery characteristics, such as the state of health of the battery.

BRIEF DESCRIPTION OF THE DRAWING FIGURES

A more complete understanding of the present technology may be derived by referring to the detailed description when considered in connection with the following illustrative figures. In the following figures, like reference numbers refer to similar elements and steps throughout the figures.

DETAILED DESCRIPTION OF EXEMPLARY EMBODIMENTS

The present technology may be described in terms of functional block components and various processing steps. Such functional blocks may be realized by any number of components configured to perform the specified functions and achieve the various results. For example, the present technology may employ various voltage sensors, current sensors, coulomb counters, logic gates, memory devices, semiconductor devices, such as transistors and capacitors, and the like, which may carry out a variety of functions. In addition, the present technology may be practiced in conjunction with any number of systems, such as automotive, aerospace, medical, scientific, surveillance, and consumer electronics, and the systems described are merely exemplary applications for the technology. Further, the present technology may employ any number of conventional techniques for measuring voltage, measuring current, measuring temperature, and the like.

Figure 1:
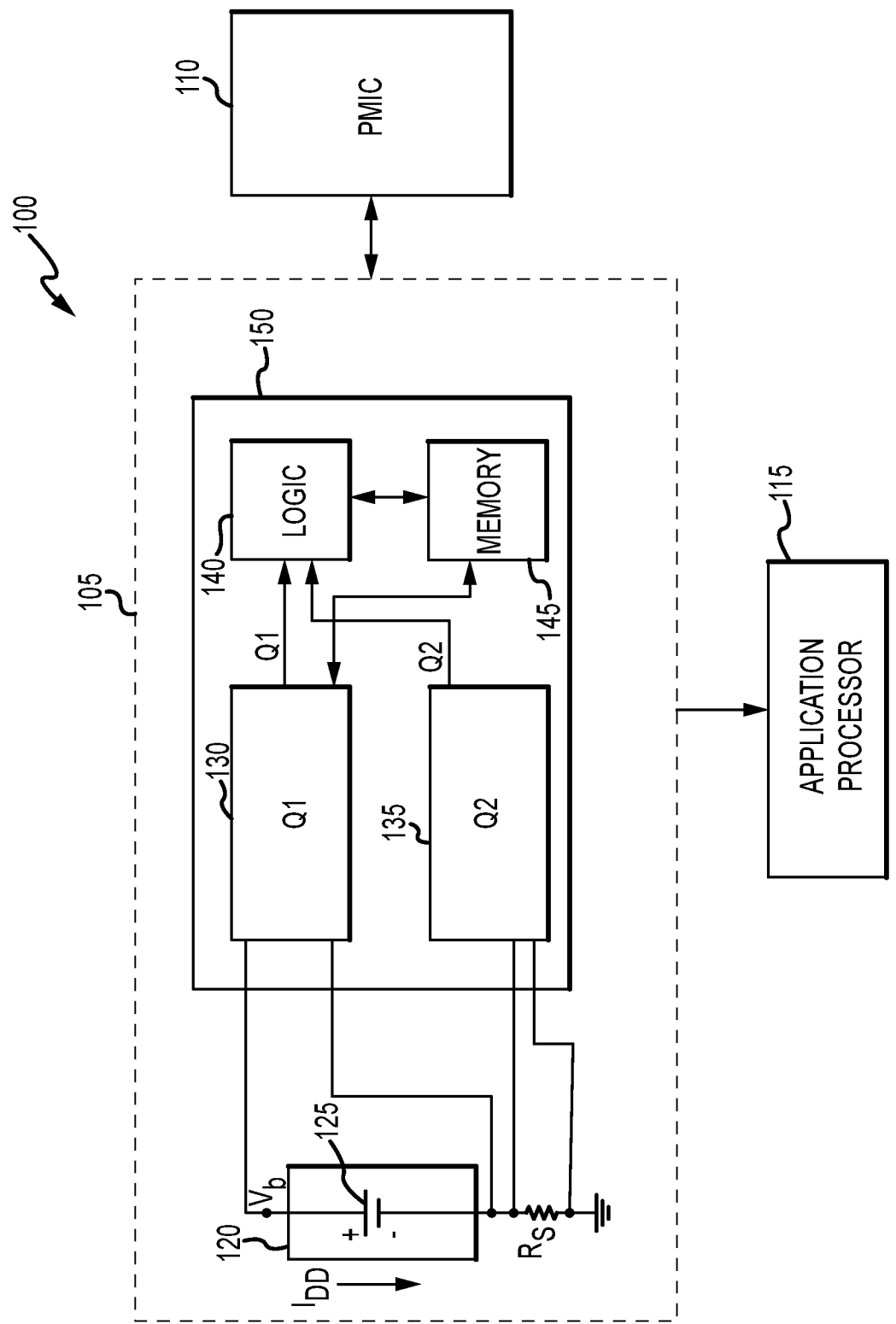
FIG. 1 is a block diagram of an electronic system in accordance with an exemplary embodiment of the present technology.

Methods and apparatus for measuring a state of health (SOH) of a battery according to various aspects of the present technology may operate in conjunction with any suitable electronic system and/or device, such as "smart devices," wearables, consumer electronics, portable devices, battery-powered vehicles, and the like. Referring to FIG. 1, an exemplary system 100 may be incorporated into an electronic device powered by a rechargeable battery, such as a lithium ion battery. For example, in various embodiments, the system 100 may comprise a battery system 105, an application processor 115, and a power management IC (PMIC) 110, that operate together to provide suitable power levels to the electronic device.

The battery system 105 may provide power and battery information to various components of the electronic device, such as the application processor 115 and the PMIC 110. The battery system 105 may be coupled to transmit data to and from the PMIC 110. The battery system 105 may further be coupled to the application processor 115 to transmit battery information, such as a capacity of the battery, a run-time of the battery, and the like. In an exemplary embodiment, the battery system 105 may comprise a battery pack 120 and a fuel gauge circuit 150. In various embodiments, the system 100 may further comprise a timing unit (not shown) to operate various circuits according to a predetermined timing cycle.

The battery pack 120 may supply power to the system 100, and may comprise a battery 125, such as a chargeable lithium ion battery. In an exemplary embodiment, the battery 125 generates an output voltage $V_b$ between a negative electrode and a positive electrode of the battery 125.

The battery pack 120 may also comprise a temperature sensor (not shown) that provides a signal according to the temperature of the battery 125. The temperature sensor may comprise a thermistor (not shown) that generates a voltage $V_t$ which corresponds to a temperature of the battery 125. The temperature sensor may, however, comprise any appropriate sensor or other device or system for generating a signal corresponding to the temperature of the battery 125.

The fuel gauge circuit 150 may be configured to receive various inputs, monitor the battery capacity, and determine the SOH for the battery 125. The fuel gauge circuit 150 may receive signals corresponding to the relevant criteria, such as a temperature signal from the temperature sensor and a voltage signal from the battery 125, as well as control signals, such as from the PMIC 110. The fuel gauge circuit 150 may also generate signals, such as signals corresponding to the SOH of the battery 125. The fuel gauge circuit 150 may comprise any number of suitable circuits and/or systems and may be implemented in any suitable manner, such as in the form of a large scale integrated (LSI) circuit. For example, in one embodiment, the fuel gauge circuit 150 may comprise a first capacity circuit 130, a second capacity circuit 135, a logic unit 140, and a memory 145. In various embodiments, the fuel gauge circuit 150 may further comprise a timer (not shown) to track and measure a time interval (period of time). For example, the timer may be utilized to facilitate integration of a current over a period of time. The time interval may be a predetermined value set according to the application, power usage limitations, and the like.

The memory 145 may be suitably configured to store programs to be executed by the logic unit 140 and various types of battery characteristic data, such as original battery specifications (e.g., full charge capacity and resistance values), aged battery specifications (e.g., aged capacity and resistance values) and/or relational data between two variables (e.g., capacity-resistance data and voltage-RSOC data). For example, the memory 145 may comprise ROM (read only memory) and RAM (random access memory). The storage area of the memory 145 may comprise a program storage unit to store programs to operate the logic unit 140.

Figure 2:
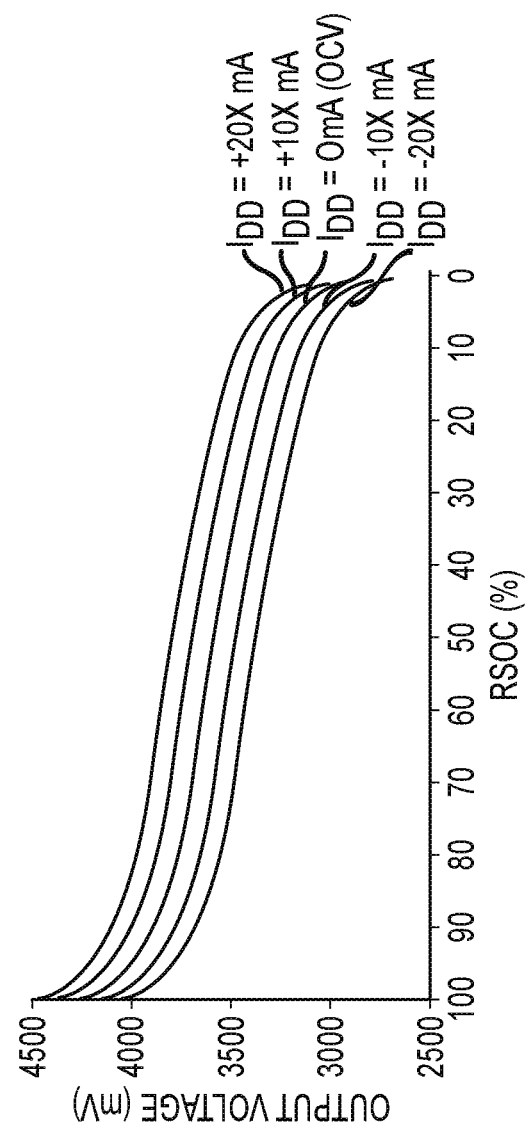
FIG. 2 is a graph illustrating a relationship between the output voltage and relative state of charge of a battery in accordance with an exemplary embodiment of the present technology.
Figure 3:
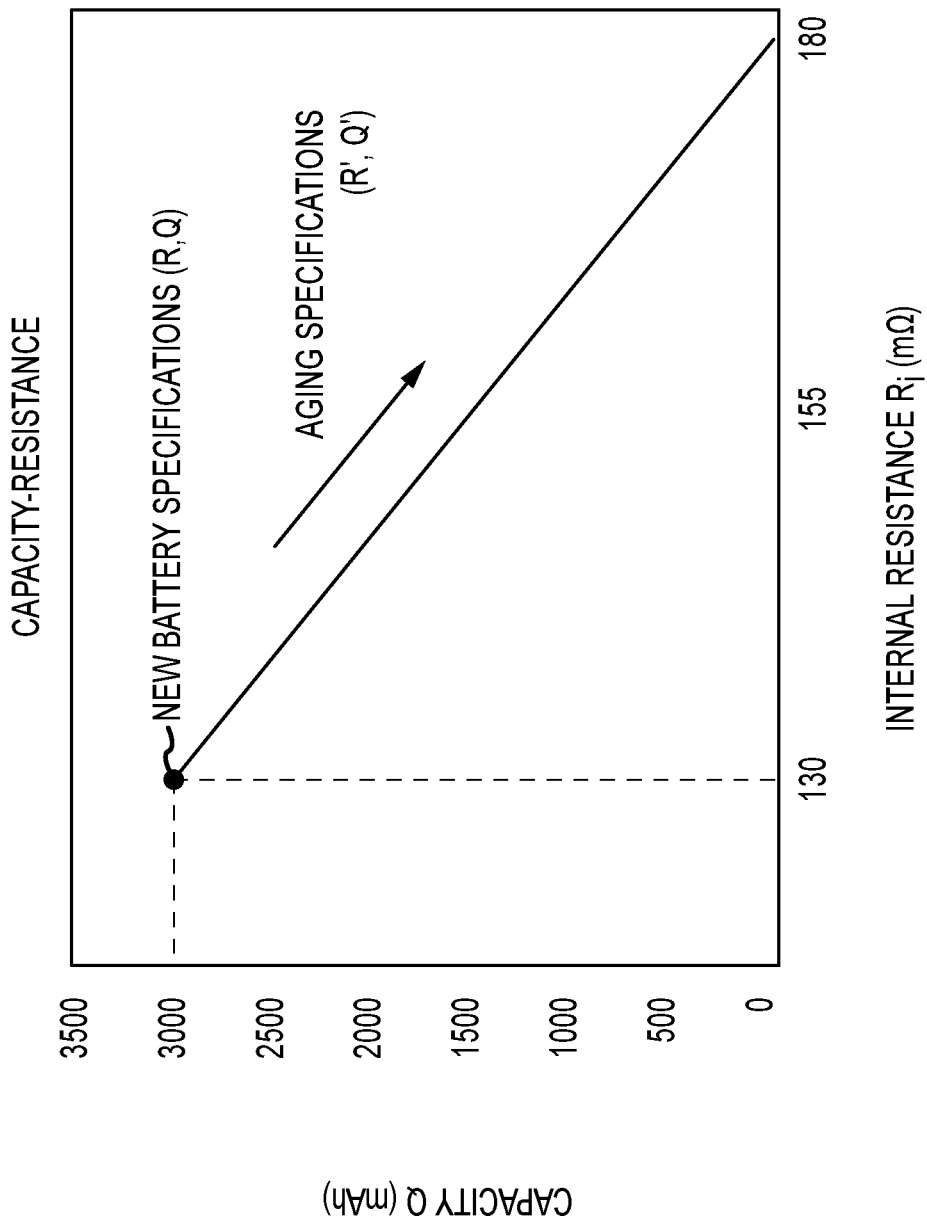
FIG. 3 is a graph illustrating a relationship between battery capacity and resistance of a new battery in accordance with an exemplary embodiment of the present technology.

The memory 145 may be configured to store various data points between two or more variables, such as in a look-up table or other suitable form. For example, and referring to FIGS. 2 and 3, the memory 145 may store data indicating a relationship between the output voltage $V_b$ of the battery 125 and the relative state of charge (RSOC) of the battery 125 (i.e., output voltage-RSOC data) (FIG. 2). Similarly, the memory 145 may store data indicating a relationship and/or correlation between the capacity of the battery 125 and the internal resistance of the battery 125 as it ages (i.e., capacity-resistance data) (FIG. 3). In general, as the battery 125 ages, the internal resistance increases and the capacity decreases. The capacity-resistance data may further contain information related to the battery specifications when the battery 125 is new and has not aged. For example, an original internal resistance value R and an original capacity Q of a new battery may be 130 m-ohms and 3000 mAh, respectively. As the battery 125 ages, the internal resistance may be referred to as an aged resistance R' and the capacity may be referred to as an aged capacity Q'.

The output voltage-RSOC data may comprise characteristic curves of the battery according to the output voltage, the RSOC, and a current value $I_{DD}$ of the battery 125. When graphed, the battery characteristics may vary according to various current $I_{DD}$ levels of the battery 125. An OCV curve corresponds to the output voltage $V_b$ of the battery 125 when the battery 125 is neither charging nor discharging. If the battery 125 is charging, the characteristic curve may increase relative to the OCV curve, or if the battery 125 is discharging, the characteristic curve may decrease relative to the OCV curve. The amount that the characteristic curve increases or decreases relative to the OCV curve depends on the magnitude and direction of the current $I_{DD}$ through the battery 125. As such, the output voltage-RSOC data may be utilized to determine if the battery 130 is charging or discharging when the output voltage $V_b$ and the RSOC are known. For example, if the output voltage $V_b$ is 3500 mV and the RSOC is 20 percent, then the fuel gauge circuit 150 may estimate the current $I_{DD}$ to be +20X mA (where X is a shift factor based on the battery specifications, such as a full charge capacity of the battery). Similarly, the RSOC may be determined if the output voltage $V_b$ and the current $I_{DD}$ through the battery 125 are known.

The first circuit 130 may be suitably configured to determine a first capacity value Q1 by converting a measured output voltage to a capacity value. The first circuit 130 may be coupled between a positive terminal (+) and a negative terminal (−) of the battery 125 and may be configured to measure the output voltage $V_b$ across the terminals. The first circuit 130 may further be coupled to the memory 145 to extract voltage-RSOC data. The first circuit 130 may utilize the measured output voltage $V_b$ and the voltage-RSOC data to determine the first capacity value Q1. For example, and referring to FIG. 2, if the measured output voltage is 3500 mV, this corresponds to approximately 55% RSOC. For a battery with a full charge capacity of, for example 3,000 mAh, 55% RSOC translates to a capacity of approximately 1,650 mAh. As such, in this example, the first capacity value Q1 may be equal 1,650 mAh. The first circuit 130 may further utilize other suitable parameters, such as a measured battery temperature, to adjust the first capacity value Q1 accordingly. For example, if the RSOC translates to 1,650 mAh, the value 1,650 mAh may be increased or decreased based on the temperature of the battery. In general, as the temperature increases, the battery capacity also increases.

In an alternative embodiment, the first circuit 130 may utilize the voltage-RSOC data to extract the current $I_{DD}$ to obtain the first capacity value Q1. For example, the measured output voltage Vb may be compared to the OCV curve to determine a change in voltage (ΔV) from a voltage value on the OCV to the measured output voltage Vb. This change in voltage corresponds to a particular current value $I_{DD}$. The first circuit 130 may then integrate the extracted current $I_{DD}$ to obtain the first capacity value Q1. In general, the change in voltage can be characterized as an internal resistance $R_i$ of the battery 125 multiplied by the current $I_{DD}$ (i.e., $\Delta V = R_i \times I_{DD}$, where $R_i$ is the internal resistance at any given time). Since the internal resistance $R_i$ of a new battery is referred to as the original internal resistance R, the change in voltage of the new battery may be characterized by the original internal resistance R multiplied by the current $I_{DD}$ (i.e., $\Delta V = R \times I_{DD}$). Similarly, since the internal resistance $R_i$ increases as the battery ages (referred to as the aged internal resistance R') the change in voltage of an aged battery may be characterized by the aged internal resistance R' multiplied by the current (i.e., $\Delta V = R' \times I_{DD}$). As such, as the battery 125 ages and the internal resistance $R_i$ increases, the aged internal resistance R' increases relative to the original internal resistance R.

The second circuit 135 may be suitably configured to determine a second capacity value Q2 by measuring the in-and-out-flowing current $I_{DD}$ of the battery 125 over a period of time and reporting the accumulated charge (i.e., the second capacity value Q2). This may be accomplished with the use a current shunt, such as a sense resistor $R_s$ coupled to the negative terminal (−) of the battery 125, wherein the second circuit 135 monitors the voltage across the sense resistor $R_s$ as the battery 125 charges and discharges as an indication of the current $I_{DD}$. The current $I_{DD}$ is then integrated over some period of time and reported as the second capacity value Q2. The second circuit 135 may comprise any suitable circuit and/or system configured to measure charge that flows into or out of the battery 125. In various embodiments, the second circuit 135 may further estimate the second capacity value Q2 based on temperature data characteristics and/or the measured temperature of the battery 125.

The logic unit 140 may control the fuel gauge circuit 150 and realize various functions by executing various programs stored in the memory 145. For example, the logic unit 140 may perform various calculations, such as computing the capacity of the battery 125, computing the RSOC of the battery 125, and computing the SOH of the battery 125. The logic unit 140 may also receive information regarding various conditions of the battery, such as the charge/discharge state of the battery 125, as well as data stored in the memory 145.

The logic unit 140 may compute the SOH of the battery 125 according to the capacity measurements of the battery 125. In an exemplary embodiment, the logic unit 140 may compute the SOH based on the various measured parameters, such as the first capacity value Q1 and the second capacity value Q2, as well as original specifications of the battery 125, such as original resistance value R.

The logic unit 140 may be configured to compute a capacity ratio $Q_R$ utilizing the first capacity value Q1 value and the second capacity value Q2 according to the following equation:

$$Q_R = Q1/Q2 \quad \text{(equation 1)}.$$

The logic unit 140 may further be configured to compute the aged resistance value R' according to following equation:

$$R' = R \times Q_R \quad \text{(equation 2)}.$$

where R is the original internal resistance value (the internal resistance value of the new battery).

The logic unit 140 may be configured to read or otherwise access stored data from the memory 140. For example, the logic unit 140 may extract the aged capacity Q' according to the aged resistance value R'.

The logic unit 140 may utilize the aged capacity Q' to compute a SOH value according to the following equation:

$$SOH = \left(\frac{Q'}{Q2}\right) \times 100. \quad \text{(equation 3)}$$

The logic unit 140 may further interpret the SOH value and provide an indicator, such as an indicator light, message, signal, and the like, to inform the user of the SOH of the battery 125. The logic unit 140 may interpret the SOH value to indicate the run-time of the battery 125, and/or the overall remaining life of the battery 125. For example, the logic unit may be adapted to provide an indication to the user whether the battery 125 is in excellent, good, declining, or bad health. The logic unit 140 may further indicate to the user to take some specific action, such as generating an indicator to replace the battery 125. For example, if the SOH value equals 50%, this means that the battery 125 has lost 50% of its charge capacity and the logic unit 140 may interpret this value as a battery with declining health and indicate to the user that the battery 125 should be replaced.

The application processor 115 may control the electronic device, for example based on signal received from the battery system 105. Further, the application processor 115 may transfer data outputted from the battery system 105 to a drive circuit (not shown), which may be configured to drive a display unit within the electronic device. The drive circuit may drive the display unit so that the remaining battery capacity, the temperature of the battery, the run-time of the battery, the SOH of the battery, and the like, can be displayed on the display unit based on the data from the application processor 115.

The PMIC 110 may manage the power requirements for the application processor 115, the fuel gauge circuit 150, and/or the battery 125. The PMIC 110 may be coupled to the battery system 105 ensure that the battery 125 is operating according to a particular set of specifications and to ensure that the battery 125 is providing an appropriate amount of power to the application processor 115. For example, the PMIC 110 may manage the battery charging cycles, perform DC to DC conversion, perform voltage scaling, perform power sequencing, perform power-source selection, and/or other miscellaneous functions. The PMIC 110 may comprise any circuit and/or system suitable for battery management, voltage regulation, charging functions, and the like. The PMIC 110 may further comprise a memory device, similar to the memory 145, to store configuration data.

In operation, the fuel gauge circuit 150 may perform a health check of battery 125 to determine the effects of aging on the battery full charge capacity, internal resistance of the battery, and remaining life of the battery. The fuel gauge circuit 150 may measure the capacity of the battery 125 using multiple methods, such as the voltage method and coulomb counting, and utilize the measured capacity values to compute the aged resistance R' of the battery 125. In various embodiments, the fuel gauge circuit 150 may compute the SOH of the battery according to the aged resistance R'.

Figure 4:
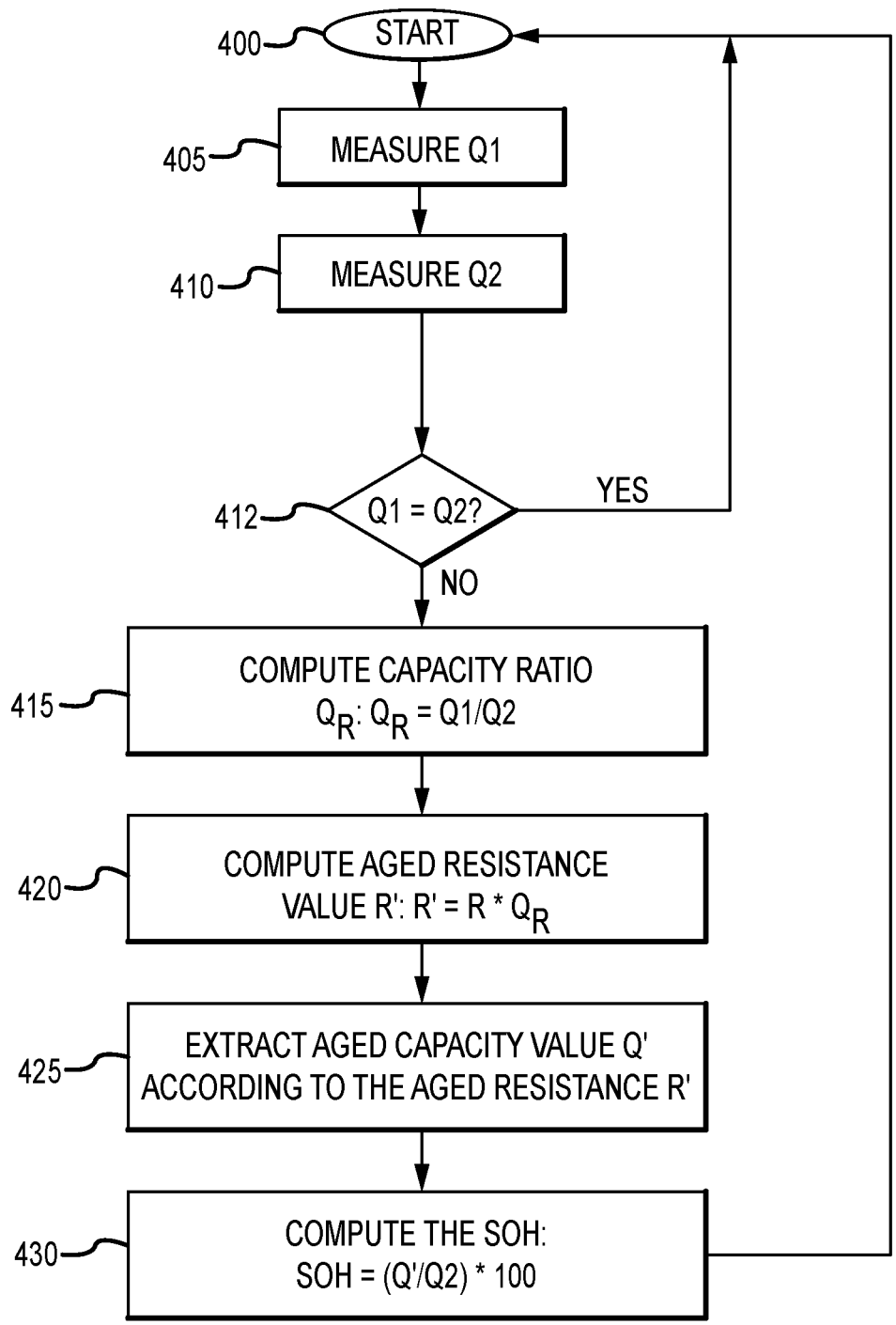
FIG. 4 is a flowchart for obtaining a state of health of a battery in accordance with an exemplary embodiment of the present technology.

In an exemplary embodiment, and referring to FIG. 4, the fuel gauge circuit 150 may measure the first capacity Q1 (405), for example according to the voltage method. The fuel gauge circuit 150 may then measure the second capacity Q2 (410), for example according to the coulomb counting method. The fuel gauge circuit 150 may employ any method of measuring the first capacity Q1 and the second capacity Q2 of the battery 125. The fuel gauge circuit 150 may store the first and second capacities Q1, Q2 in a storage device, such as memory 145.

The fuel gauge circuit 150 may then compute the capacity ratio $Q_R$ (415) according to equation 1 above. For example, the fuel gauge circuit 150 may employ the logic unit 140 to retrieve the first and second capacities Q1, Q2 from the memory 145 and compute the capacity ratio $Q_R$.

In various embodiments, the fuel gauge circuit 150 may compare the first capacity value Q1 and the second capacity value Q2 to determine if the first capacity value Q1 is equal to the second capacity value Q2 (412). If one of the capacity values is greater than the other, it may be assumed that the battery 125 has aged, since the both capacity values Q1, Q2 should be substantially equal when the battery 125 is new. In general, the first capacity value Q1 will increase with age, while the second capacity value Q2 will remain relatively constant. As such, the first capacity value Q1 will be either equal (or substantially equal) to the second capacity value Q2 when the battery 125 is new, and the first capacity value Q1 will be greater than the second capacity value Q2 as the battery 125 ages. If the first capacity value Q1 and the second capacity value Q2 are not equal, this condition may indicate an aged battery, and the fuel gauge 150 may compute the aged resistance value R'. If the first capacity value Q1 is equal (or substantially equal) to the second capacity value Q2, then the fuel gauge circuit 150 may return to the start (400) of the operation. Since the methods for determining the first capacity value Q1 and the second capacity value Q2 are different, have different measurement parameters, and different points of measurement, the two capacity values Q1, Q2 may differ slightly even when the battery 125 is new. The fuel gauge circuit 150 may determine that the first and second capacity values Q1, Q2 are equal, for purposes of computing the aged resistance R', if the values are within a predetermined margin of error, such as 0.1%.

The fuel gauge circuit 150 may then compute the aged resistance value R' (420) according to equation 2 above. For example, the fuel gauge circuit 150 may employ the logic unit 140 to retrieve the original resistance value R from the memory 145 and compute the aged resistance value R'.

The fuel gauge circuit 150 may then extract the aged capacity value Q' corresponding to the aged resistance value R' (425). For example, the logic unit 140 may retrieve and utilize the capacity-resistance data from the memory 145 to determine the aged capacity Q' corresponding to the aged resistance value R'.

In various embodiments, the fuel gauge circuit 150 may utilize the aged resistance value R' to compute various parameters related to the battery 125. For example, the fuel gauge circuit 150 may compute the SOH of the battery 125 according to the aged capacity value Q' (430). In various embodiments, the fuel gauge circuit 150 may employ the logic unit 140 to retrieve the second capacity value Q2 and compute the SOH according equation 3 above.

According to various embodiments, the fuel gauge circuit 150 may transmit the SOH to the application processor 115, wherein the application processor 115 may provide an alert or appropriate notification to the user. For example, the application processor 115 may convert the SOH to a corresponding indicator and/or parameter of the health of battery 125, such as "excellent," "average," and "poor." The application processor 115 may further notify the user, via a display screen (not shown) and/or an audio component (not shown), to replace the battery 125 if the SOH falls below a predetermined value. The parameters (indicators) corresponding to a particular SOH value may be based on the specifications of the battery 125, such as the full charge capacity, temperature, operating specifications, and the like.

In various embodiments, the fuel gauge circuit 150 may measure the first and second capacity values Q1, Q2 according to a predetermined health check schedule. The health check schedule may be based on the particular application of the battery 125, such as a cell phone or automobile, the battery specifications, and/or any other suitable parameters. For example, in the case of a battery-powered automobile, the fuel gauge circuit 150 may perform the health check every 6 months.

In the foregoing description, the technology has been described with reference to specific exemplary embodiments. The particular implementations shown and described are illustrative of the technology and its best mode and are not intended to otherwise limit the scope of the present technology in any way. Indeed, for the sake of brevity, conventional manufacturing, connection, preparation, and other functional aspects of the method and system may not be described in detail. Furthermore, the connecting lines shown in the various figures are intended to represent exemplary functional relationships and/or steps between the various elements. Many alternative or additional functional relationships or physical connections may be present in a practical system.

The technology has been described with reference to specific exemplary embodiments. Various modifications and changes, however, may be made without departing from the scope of the present technology. The description and figures are to be regarded in an illustrative manner, rather than a restrictive one and all such modifications are intended to be included within the scope of the present technology. Accordingly, the scope of the technology should be determined by the generic embodiments described and their legal equivalents rather than by merely the specific examples described above. For example, the steps recited in any method or process embodiment may be executed in any order, unless otherwise expressly specified, and are not limited to the explicit order presented in the specific examples. Additionally, the components and/or elements recited in any apparatus embodiment may be assembled or otherwise operationally configured in a variety of permutations to produce substantially the same result as the present technology and are accordingly not limited to the specific configuration recited in the specific examples.

Benefits, other advantages and solutions to problems have been described above with regard to particular embodiments. Any benefit, advantage, solution to problems or any element that may cause any particular benefit, advantage or solution to occur or to become more pronounced, however, is not to be construed as a critical, required or essential feature or component.

The terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present technology, in addition to those not specifically recited, may be varied or otherwise particularly adapted to specific environments, manufacturing specifications, design parameters or other operating requirements without departing from the general principles of the same.

The present technology has been described above with reference to an exemplary embodiment. However, changes and modifications may be made to the exemplary embodiment without departing from the scope of the present technology. These and other changes or modifications are intended to be included within the scope of the present technology, as expressed in the following claims.

The invention claimed is:

1. An apparatus for determining a state of health of a battery, comprising:
   a fuel gauge circuit, coupled to the battery, and configured to:
   compute a first battery capacity according to a change in an output voltage of the battery;
   compute a second battery capacity according to a voltage across a current shunt coupled to a negative terminal of the battery;
   compute a capacity ratio according to the computed first and second battery capacities;
   compute an aged resistance value according to the computed capacity ratio;

utilize battery characteristic data to determine an aged capacity according to the computed aged resistance value; and compute the state of health according to the computed aged capacity and the computed second battery capacity.

2. The apparatus according to claim 1, wherein the battery characteristic data describes a correlation between a battery resistance and a battery capacity as the battery ages.

3. The apparatus according to claim 1, wherein:
the fuel gauge circuit comprises a first circuit coupled to a positive terminal of the battery and configured to compute the first battery capacity; and
the first circuit converts the change in the output voltage to a current and integrates the current over a period of time.

4. The apparatus according to claim 3, wherein:
the fuel gauge circuit further comprises a second circuit coupled to the negative terminal of the battery; and
the second circuit converts the voltage across the current shunt to a current and integrates the current over a period of time.

5. The apparatus according to claim 4, wherein:
fuel gauge circuit further comprises a logic unit coupled to the first circuit and the second circuit; and
the logic unit computes the capacity ratio by dividing the first battery capacity by the second battery capacity.

6. The apparatus according to claim 4, wherein:
the fuel gauge circuit further comprises a logic unit coupled to the first circuit and the second circuit; and
the logic unit computes the aged resistance by multiplying an original resistance by the capacity ratio.

7. The apparatus according to claim 4, wherein:
the fuel gauge circuit further comprises a logic unit coupled to the first circuit and the second circuit; and
the logic unit computes the state of health by dividing the aged capacity by the second battery capacity.

8. A method for determining a state of health of a battery, comprising:
computing a first battery capacity based on the change in an output voltage of the battery;
computing a second battery capacity based on a voltage across a current shunt;
computing a capacity ratio based on the computed first battery capacity and the computed second battery capacity;
computing an aged resistance value based on an original resistance value and the computed capacity ratio;
utilizing capacity-resistance data of the battery to determine an aged capacity according to the computed aged resistance; and
computing the state of health based on the computed aged capacity and the computed second battery capacity.

9. The method for determining a state of health of a battery according to claim 8, wherein computing a first battery capacity comprises:
converting the change in the output voltage to a current; and
integrating the current over a period of time.

10. The method for determining a state of health of a battery according to claim 8, wherein computing the second battery capacity comprises:

converting the voltage across the current shunt to a current; and
integrating the current over a period of time.

11. The method for determining a state of health of a battery according to claim 8, wherein computing an aged resistance value comprises multiplying the capacity ratio by the original resistance value.

12. The method for determining a state of health of a battery according to claim 8, wherein computing a capacity ratio comprises dividing the first battery capacity by the second battery capacity.

13. The method for determining a state of health of a battery according to claim 8, wherein computing the state of health comprises dividing the aged capacity by the second battery capacity.

14. A system capable of monitoring a battery and battery characteristics, comprising:
a fuel gauge circuit coupled to the battery, comprising:
a first circuit coupled to the battery, and configured to compute a first battery capacity according to an output voltage of the battery;
a second circuit coupled to the battery, and configured to compute a second battery capacity according to a voltage across a current shunt; and
a logic unit coupled to the first circuit and the second circuit, and configured to:
compute a capacity ratio according to the first and second battery capacities;
compute an aged resistance value according to the computed capacity ratio;
utilize battery characteristic data to determine an aged capacity according to the computed aged resistance value; and
compute the state of health according to the computed aged capacity and the computed second battery capacity; and
an application processor coupled to the fuel gauge circuit and configured to provide an indicator reflecting the state of health of the battery.

15. The system according to claim 14, wherein the first circuit is coupled to a positive terminal of the battery and converts the change in the output voltage to a current and integrates the current over a period of time.

16. The system according to claim 14, wherein:
the second circuit converts the voltage across the current shunt to a current and integrates the current over a period of time; and
the current shunt is coupled to the negative terminal of the battery.

17. The system according to claim 14, wherein the logic unit computes the capacity ratio by dividing the first battery capacity by the second battery capacity.

18. The system according to claim 14, wherein the logic unit computes the aged resistance by multiplying an original resistance by the capacity ratio.

19. The system according to claim 14, wherein the logic unit computes the state of health by dividing the aged capacity by the second battery capacity.

20. The system according to claim 14, wherein the battery characteristic data describes a correlation between a battery resistance and a battery capacity as the battery ages.

* * * * *